(12) United States Patent
Takemura

(10) Patent No.: US 9,472,683 B2
(45) Date of Patent: Oct. 18, 2016

(54) FIELD EFFECT TRANSISTOR

(71) Applicant: Semiconductor Energy Laboratory Co., Ltd., Atsugi-shi, Kanagawa-ken (JP)

(72) Inventor: Yasuhiko Takemura, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/055,907

(22) Filed: Feb. 29, 2016

(65) Prior Publication Data

US 2016/0181433 A1 Jun. 23, 2016

Related U.S. Application Data

(63) Continuation of application No. 14/753,681, filed on Jun. 29, 2015, now Pat. No. 9,281,412, which is a continuation of application No. 13/155,759, filed on Jun. 8, 2011, now Pat. No. 9,209,314.

(30) Foreign Application Priority Data

Jun. 16, 2010 (JP) ................................. 2010-136705

(51) Int. Cl.
*H01L 29/786* (2006.01)
*H01L 29/24* (2006.01)
(Continued)

(52) U.S. Cl.
CPC ... *H01L 29/78696* (2013.01); *H01L 21/02565* (2013.01); *H01L 21/823814* (2013.01); *H01L 29/24* (2013.01); *H01L 29/41725* (2013.01); *H01L 29/7869* (2013.01)

(58) Field of Classification Search
CPC ............... H01L 21/02565; H01L 21/823814; H01L 29/78696; H01L 29/41725; H01L 29/7869

See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

CN 101582453 A 11/2009
EP 1737044 A 12/2006
(Continued)

OTHER PUBLICATIONS

International Search Report (Application No. PCT/JP2011/063757) Dated Sep. 20, 2011.
(Continued)

*Primary Examiner* — Joseph C Nicely
(74) *Attorney, Agent, or Firm* — Robinson Intellectual Property Law Office; Eric J. Robinson

(57) ABSTRACT

An insulating film is provided over one surface of a first semiconductor layer including a first oxide semiconductor including indium as a main component, and a second semiconductor layer including an i-type second oxide semiconductor is provided in contact with the other surface. The energy difference between a vacuum level and a Fermi level in the second oxide semiconductor is larger than that in the first oxide semiconductor. In the first semiconductor layer, a region in the vicinity of the junction surface with the second oxide semiconductor which satisfies the above condition is a region having an extremely low carrier concentration (a quasi-i-type region). By using the region as a channel, the off-state current can be reduced. Further, a drain current of the FET flows through the first oxide semiconductor having a high mobility; accordingly, a large amount of current can be extracted.

17 Claims, 7 Drawing Sheets

(51) Int. Cl.
*H01L 29/417* (2006.01)
*H01L 21/8238* (2006.01)
*H01L 21/02* (2006.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,994,500 B2 | 8/2011 | Kim et al. |
| 8,058,645 B2 | 11/2011 | Jeong et al. |
| 8,148,779 B2 | 4/2012 | Jeong et al. |
| 8,158,976 B2 | 4/2012 | Son et al. |
| 8,188,480 B2 | 5/2012 | Itai |
| 8,203,143 B2 | 6/2012 | Imai |
| 8,314,032 B2 | 11/2012 | Kawamura et al. |
| 8,319,905 B2 | 11/2012 | Yoon et al. |
| 8,384,076 B2 | 2/2013 | Park et al. |
| 8,395,931 B2 | 3/2013 | Yamazaki et al. |
| 8,399,882 B2 | 3/2013 | Jeon et al. |
| 8,445,902 B2 | 5/2013 | Sato et al. |
| 8,481,377 B2 | 7/2013 | Akimoto et al. |
| 8,513,661 B2 | 8/2013 | Takahashi et al. |
| 8,530,273 B2 | 9/2013 | Den Boer |
| 8,618,537 B2 | 12/2013 | Kaneko et al. |
| 8,624,240 B2 | 1/2014 | Sato et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0248422 A1 | 12/2004 | Kim |
| 2005/0017302 A1 | 1/2005 | Hoffman |
| 2005/0199879 A1 | 9/2005 | Hoffman et al. |
| 2005/0199959 A1 | 9/2005 | Chiang et al. |
| 2006/0003485 A1 | 1/2006 | Hoffman et al. |
| 2006/0035452 A1 | 2/2006 | Carcia et al. |
| 2006/0043377 A1 | 3/2006 | Hoffman et al. |
| 2006/0079034 A1 | 4/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0032465 A1 | 2/2008 | Ahn et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0191204 A1 | 8/2008 | Kim et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0236596 A1 | 9/2009 | Itai |
| 2009/0278122 A1 | 11/2009 | Hosono et al. |
| 2009/0280600 A1 | 11/2009 | Hosono et al. |
| 2009/0283763 A1 | 11/2009 | Park et al. |
| 2009/0321731 A1 | 12/2009 | Jeong et al. |
| 2010/0065844 A1 | 3/2010 | Tokunaga |
| 2010/0067097 A1 | 3/2010 | Hong et al. |
| 2010/0092800 A1 | 4/2010 | Itagaki et al. |
| 2010/0109002 A1 | 5/2010 | Itagaki et al. |
| 2010/0109003 A1 | 5/2010 | Akimoto et al. |
| 2010/0117078 A1 | 5/2010 | Kuwabara et al. |
| 2010/0117999 A1 | 5/2010 | Matsunaga et al. |
| 2010/0133530 A1 | 6/2010 | Akimoto et al. |
| 2010/0148169 A1 | 6/2010 | Kim et al. |
| 2010/0219410 A1 | 9/2010 | Godo et al. |
| 2010/0237403 A1 | 9/2010 | Ahn et al. |
| 2010/0264403 A1 | 10/2010 | Sirringhaus et al. |
| 2011/0057185 A1 | 3/2011 | Peng et al. |
| 2011/0127598 A1 | 6/2011 | Forbes et al. |
| 2011/0147738 A1 | 6/2011 | Yamazaki et al. |
| 2011/0182110 A1 | 7/2011 | Yamazaki et al. |
| 2011/0193078 A1 | 8/2011 | Takemura |
| 2011/0193083 A1 | 8/2011 | Kim et al. |
| 2011/0193182 A1 | 8/2011 | Takemura |
| 2011/0204362 A1 | 8/2011 | Akimoto et al. |
| 2012/0001167 A1 | 1/2012 | Morosawa |
| 2012/0119205 A1 | 5/2012 | Taniguchi et al. |
| 2012/0242627 A1 | 9/2012 | Kim et al. |
| 2013/0005082 A1 | 1/2013 | Kim et al. |
| 2013/0037793 A1 | 2/2013 | Pan et al. |
| 2013/0127694 A1 | 5/2013 | Kim et al. |

(56) References Cited

U.S. PATENT DOCUMENTS

| | | |
|---|---|---|
| 2013/0309808 A1 | 11/2013 | Zhang et al. |
| 2014/0054661 A1 | 2/2014 | Yu et al. |

FOREIGN PATENT DOCUMENTS

| | | |
|---|---|---|
| EP | 2120267 A | 11/2009 |
| EP | 2226847 A | 9/2010 |
| EP | 2408011 A | 1/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2009-170905 A | 7/2009 |
| JP | 2009-231613 A | 10/2009 |
| JP | 2009-278115 A | 11/2009 |
| JP | 2010-016347 A | 1/2010 |
| JP | 2010-040552 A | 2/2010 |
| JP | 2010-067648 A | 3/2010 |
| JP | 2010-067954 A | 3/2010 |
| JP | 2010-073881 A | 4/2010 |
| WO | WO-2004/114391 | 12/2004 |

OTHER PUBLICATIONS

Written Opinion (Application No. PCT/JP2011/063757) Dated Sep. 20, 2011.

Jeong.W et al., "35.2: High-Performance Solution-Processed Oxide TFT with Dual Channel at Low Temperature", SID Digest '11 : SID International Symposium Digest of Technical Papers, 2011, pp. 476-478.

Wakana.H et al., "P-17: Amorphous ZTO/ITO Stacked-Channel TFTs with Field Effect Mobility over 50 cm2/Vs and Resistant to Channel Thickness Dispersion", SID Digest '10 : SID International Symposium Digest of Technical Papers, 2010, pp. 1287-1290.

Taniguchi.S et al., "Transparent oxide thin-film transistors using modulation-doped heterostructures", Extended Abstracts of the 2010 International Conference on Solid State Devices and Materials, 2010, pp. 383-384.

Kim.S et al., "4.1 High Performance Oxide Thin Film Transistors with Double Active Layers", IEDM 08: Technical Digest of International Electron Devices Meeting, Dec. 15, 2008.

Yin.H et al., "High Performance Low Voltage Amorphous Oxide TFT Enhancement/Depletion Inverter through Uni-/Bi-Layer Channel Hybrid Integration", IEDM 09: Technical Digest of International Electron Devices Meeting, Dec. 7, 2009, pp. 199-202.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N at al., "Spinel, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000°C.", Journal of Solid State Chemistry, 1985, vol. 60, pp. 382-384.

Nakamura.M at al., "The phase relations in the In2O3—Ga2ZnO4-ZnO system at 1350°C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Chern.H at al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In, Ga; m=Integer) Described by Four-Dimensional Superspace Group", Journal of Solid State Chemistry, 1998, vol. 139, pp. 347-355.

Kikuchi.H at al., "Polymer-Stabilized Liquid Crystal Blue Phases", Nature Materials, Sep. 2, 2002, vol. 1, pp. 64-68.

Tsuda.K at al., "Ultra Low Power Consumption Technologies for Mobile TFT-LCDs ", IDW '02 : Proceedings of the 9th International Display Workshops, Dec. 4, 2002, pp. 295-298.

Nomura.K at al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using Cg—Silicon Technology", SID Digest '04 : SID International Sympsium Digest of Technical Papers, 2004, vol. 36, pp. 860-863.

Nomura.K et al., "Room-Temperature Fabrication of Transparent Flexible Thin-Film Transistors using Amorphous Oxide Semiconducators", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "Suftla Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J at al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

(56) References Cited

OTHER PUBLICATIONS

Lee.J et al., "World's Largest (15-Inch) XGA AMLCD Panel Using IGZO Oxide TFT", SID Digest '08 : SID International Syposium Digest of Technical Papers, May 20, 2008, vol. 39, pp. 625-628.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Takahashi.M et al., "Theoretical Analysis of IGZO Transparent Amorphous Oxide Semicondutor", IDW '08 : Proceedings of the 15th International Display Workshops, Dec. 3, 2008, pp. 1637-1640.
Sakata.J et al., "Development of 4.0-In. AMOLED Display with Driver Circuit Using Amorphous In—Ga—Zn—Oxide TFTs", IDW '09 : Proceedings of the 16th International Display Workshops, 2009, pp. 689-692.
Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White Tandem OLEDs", SID Digest '09 : SID Internatioanl Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Ohara.H et al., "21.3:4.0 In. QVGA AMOLED Display Using In—Ga—Zn—Oxide TFTs with a Novel Passivations Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn—Oxide TFT", SID Digest '09 : SID International Syposium Digest of Technical Papers, May 31, 2009, pp. 1110-1112.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters) , 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Appled Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Son.K et al., "42.4L: Late-News Paper; 4 Inch QVGA AMOLED Driven by the Threshold Voltage Controlled Amorphous GIZO (Ga2O3—In2O3—ZnO) TFT", SID Digest '08 : SID Internatioanl Symposium Digest of Technical Papers, May 20, 2008, vol. 39, pp. 633-636.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Fung.T et al., "2-D Numerical Simulation of High Performance Amorphous In—Ga—Zn—O TFTs for Flat Panel Diplays", AM-FPD '08 Digest of Technical Papers, Jul. 2, 2008, pp. 251-252, The Japan Society of Applied Physics.
Mo.Y et al., "Amorphous Oxide TFT Backplanes for Large Size AMOLED Displays", IDW '08 : Proceedings of the 6th Internatioanl Display Workshops, Dec. 3, 2008, pp. 581-584.
Asakuma.N et al., "Crystallization and Reduction of SOL-GEL-Derived Zinc Oxide Films by Irradiation with Ultraviolet Lamp", Journal of Sol-Gel Science and Technology, 2003, vol. 26, pp. 181-184.

(56) References Cited

OTHER PUBLICATIONS

Fortunato.E et al., "Wide-Bandgap High-Mobility ZnO Thin-Film Transistors Produced At Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

Chinese Office Action (Application No. 201180028198.9) Dated Mar. 24, 2015.

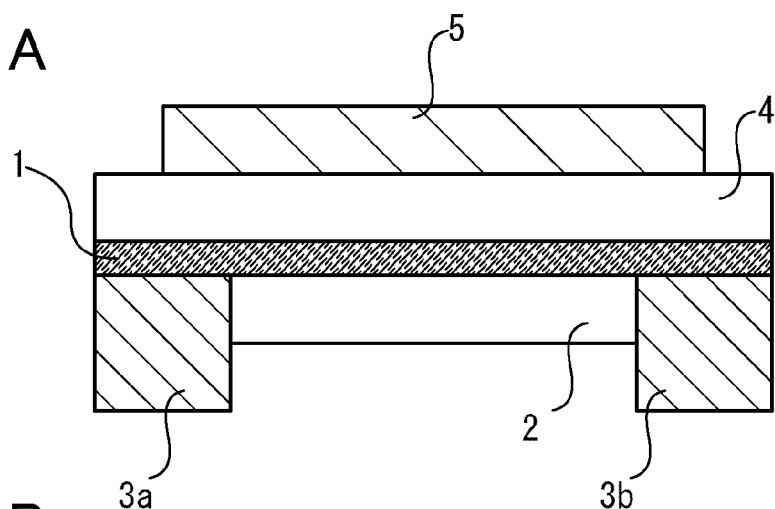
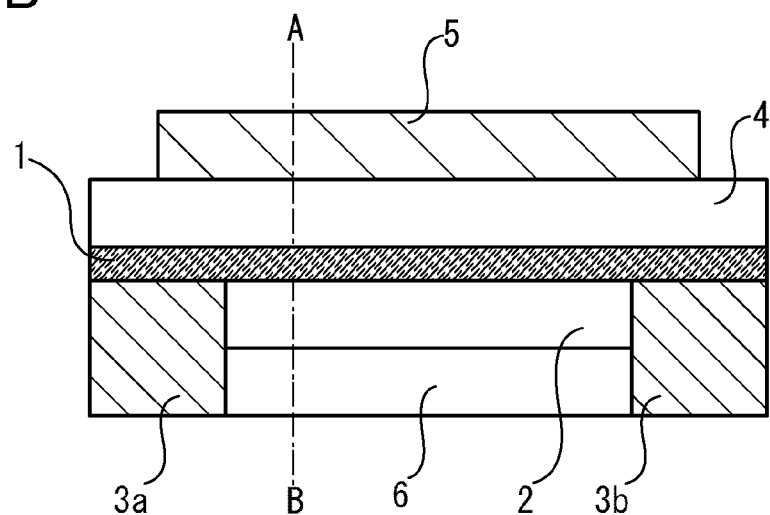
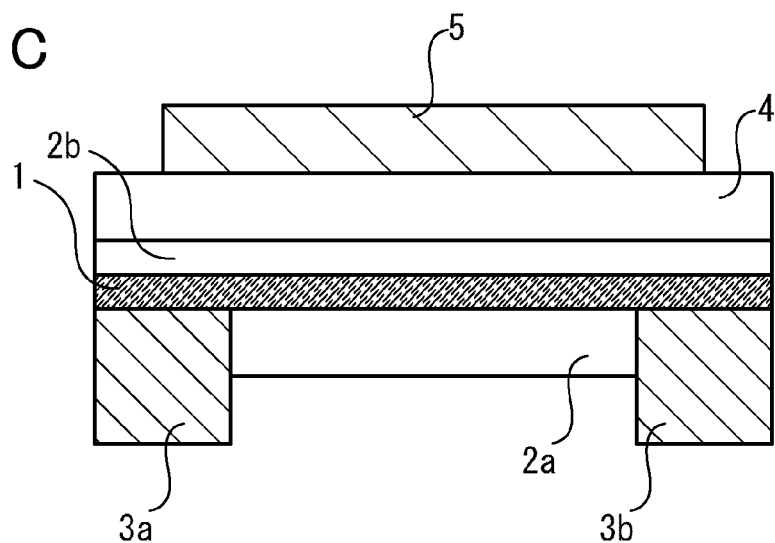

FIELD EFFECT TRANSISTOR

TECHNICAL FIELD

The present invention relates to a field effect transistor (FET) including an oxide semiconductor.

BACKGROUND ART

A field effect transistor (FET) is a device in which regions called a source and a drain are provided in a semiconductor, each of the regions is provided with an electrode, potentials are supplied to the electrodes, and an electric field is applied to the semiconductor with the use of an electrode called a gate through an insulating film or a Schottky barrier so that the state of the semiconductor is controlled, whereby current flowing between the source and the drain is controlled. As the semiconductor, Group IV elements (also referred to as Group 14 elements) such as silicon and germanium, Group III-V compounds such as gallium arsenide, indium phosphide, and gallium nitride, Group II-VI compounds such as zinc sulfide and cadmium telluride, and the like can be given.

In recent years, FETs in which oxides such as indium oxide (Patent Document 1), zinc oxide (Patent Documents 2 and 4), and an indium gallium zinc oxide-based compound (Patent Document 3) are used as semiconductors have been reported. In a FET including such an oxide semiconductor, relatively high mobility can be obtained, and such a material has a wide bandgap of greater than or equal to 3 eV; therefore, application of the FET including an oxide semiconductor to displays, power devices, and the like is examined.

To be specific, it is reported that the field effect mobility of a FET including zinc oxide or an indium-gallium-zinc-oxide-based compound is 20 cm$^2$/Vs at most, while the field effect mobility of a FET including indium oxide as a main component is 50 cm$^2$/Vs or higher. It is empirically clear that a higher field effect mobility can be obtained with a higher ratio of indium in an oxide.

In general, an oxide semiconductor including zinc or indium as a main component (here, "the main component" refers to an element accounting for 50 at. % or more of all elements having an atomic number of 11 or more in the oxide semiconductor) and showing a p-type conductivity has not been reported so far. Accordingly, a FET using a PN junction like a FET including silicon has not been reported. As disclosed in Patent Documents 1 to 4, a metal-semiconductor junction in which a conductive electrode is in contact with an n-type or i-type (in this specification, "an i-type semiconductor" refers to a semiconductor having a carrier concentration of lower than or equal to 1×10$^{14}$/cm$^3$) oxide semiconductor has been used for forming a source and a drain.

FIG. 7A illustrates an example of a conventional FET including an oxide semiconductor. Here, a gate insulating film 14 is provided in contact with one surface of a semiconductor layer 11 including an oxide semiconductor, and a gate 15 is provided over the gate insulating film 14. A source electrode 13a and a drain electrode 13b are provided on the other surface of the semiconductor layer 11.

The thickness of the semiconductor layer 11 has not been particularly considered in many cases. In addition, as a material of the gate insulating film 14, silicon oxide, silicon nitride, or the like has been used, and the thickness of the gate insulating film 14 has not been considered particularly as well. A material of the source electrode 13a and the drain electrode 13b has not also been considered particularly, and titanium, molybdenum, and the like have been reported.

In practice, a protective insulating film 16 is provided in contact with the semiconductor layer 11 as illustrated in FIG. 7B. As a material of the protective insulating film 16, a material that can be used as a material of the gate insulating film 14 is used.

In a FET, it is generally preferable that an ohmic contact is formed in a contact portion between a source electrode and a semiconductor layer or a contact portion between a drain electrode and a semiconductor layer. For this purpose, the material of the source electrode 13a and the drain electrode 13b is preferably a material having a work function lower than the electron affinity of an oxide semiconductor that is used for the semiconductor layer 11. For example, work functions of titanium and molybdenum are lower than the electron affinity of indium oxide (approximately 4.8 eV) and thus preferable in terms of forming an ohmic contact.

Further, in portions where the metal is in contact with the semiconductor layer 11, electrons are injected from the metal to the semiconductor layer 11, so that the concentration of electrons in the semiconductor layer 11 is increased, which couples regions having high electron concentration together particularly in the case of a short-channel FET having a channel length (the distance between the source electrode 13a and the drain electrode 13b) of 0.3 μm or less, and is a factor of a reduction of FET characteristics (e.g., a negative shift of the threshold voltage, an increase in S value, and a phenomenon in which current flows between a source and a drain in an off state (off-state current)).

In a FET in which a source and a drain are formed using a metal-semiconductor junction, a higher carrier concentration of a semiconductor causes a larger off-state current. In other words, even when the source-gate voltage (hereinafter referred to as a gate voltage) is 0 V, a substantial amount of current (hereinafter referred to as a drain current) flows between the source and the drain (this FET characteristic is called "normally on"). For this reason, it is expected that the off-state current is reduced by reducing the concentration of carriers in the semiconductor so that the semiconductor is formed to be an i-type semiconductor and that the drain current at a gate voltage of 0 V is 1×10$^{-9}$ A or lower, preferably 1×10$^{-12}$ A or lower, and further preferably 1×10$^{-15}$ A or lower.

However, oxygen deficiency is likely to be caused in indium oxide or an oxide semiconductor including indium as a main component, and it has been difficult to set the carrier concentration to 1×10$^{18}$/cm$^3$ or lower. Accordingly, a FET including an oxide semiconductor including indium as a main component has high mobility but is normally on, and this tendency becomes more significant as the concentration of indium becomes higher. For example, in the case of using indium oxide, the drain current cannot be 1×10$^{-9}$ A or lower unless the gate voltage is set to be −10 V or lower.

REFERENCE

Patent Document

[Patent Document 1] Japanese Published Patent Application No. H5-251705
[Patent Document 2] United States Patent Application Publication No. 2005/0199879
[Patent Document 3] United States Patent Application Publication No. 2007/0194379

[Patent Document 4] United States Patent Application Publication No. 2009/0283763

DISCLOSURE OF INVENTION

The present invention achieves at least one of the objects described below. An object is to provide a FET which includes an oxide semiconductor including indium as a main component and has a high mobility and a normally off characteristic (the threshold voltage is 0 V or higher) or a characteristic close to the normally off characteristic. Another object is to provide a FET including an oxide semiconductor in which the percentage of indium to all elements other than oxygen is 50% or more and preferably 75% or more and having a normally off characteristic or a characteristic close to the normally off characteristic. Another object is to provide any one of the followings: a novel FET having a metal-semiconductor junction and including indium as a main component, a novel semiconductor device having a metal-semiconductor junction and including indium as a main component, a manufacturing method of the novel FET, and a manufacturing method of the novel semiconductor device.

Note that the description of these objects does not disturb the existence of other objects. Note that one embodiment of the present invention does not necessarily achieve all the objects listed above. In addition, other objects will be apparent from and can be derived from the description of the specification, the drawings, the claims, and the like.

The present invention will be described below; terms used in this specification are briefly explained. Terms which are not defined in this specification (including terms used for science and technology, such as technical terms or academic terms) can be used as the terms having meaning equal to general meaning that an ordinary person skilled in the art understands. It is preferable that terms defined by dictionaries or the like be construed to have meanings consistent with the background of related art. One embodiment of the present invention should not be construed as being limited by the technical terms.

As for a source and a drain of a FET in this specification, a terminal supplied with a higher potential is referred to as a drain and the other terminal is referred to as a source in an n-channel FET, and a terminal supplied with a lower potential is referred to as a drain and the other terminal is referred to as a source in a p-channel FET. In the case where the same potential is supplied to the two terminals, one of them is referred to as a source and the other is referred to as a drain. In addition, the terms "first electrode" and "second electrode" are used instead of the terms "source electrode" and "drain electrode" in some cases. In that case, the names are not changed depending on the level of a potential.

Further in this specification, "a main component" refers to an element accounting for 50 at. % or more of all elements having an atomic number of 11 or more in the target object. For example, in the case of a compound whose nominal composition formula is represented by $Ga_3Al_2In_5O_{12}N_2$, oxygen (O) is the element accounting for the largest portion of the compound; however, oxygen has an atomic number of 8 and is not regarded as a main component. Similarly, nitrogen (N) does not serve as a main component. Gallium (Ga), aluminum (Al), or indium (In) can serve as a main component, and the ratio thereof is as follows: Ga:Al:In=3:2:5. In other words, the percentages of gallium, aluminum, and indium to the all elements of the possible main components are 30 at. %, 20 at. %, and 50 at. %, respectively. Therefore, in the above definition, indium is a main component and gallium and aluminum are not main components.

The nominal composition ratio, a compound having the nominal composition ratio, and the nominal chemical formula (or the nominal composition formula) refer to a ratio of elements that exist in a region, a compound having such a ratio of elements, and a chemical formula based on such a ratio of elements, respectively and are not the terms in consideration of the microscopic or local ratio, the chemical meaning, stability, and the like. In the above example, those elements may form a solid solution at the above ratio, or one molecule of $Ga_2O_3$, two molecules of AlN, two molecules of $In_2O_3$, and one molecule of $InGaO_3$ may form a mixed crystal or a mixture.

Note that in this specification and the like, terms such as "first", "second", and "third" are used for distinguishing various elements, members, regions, layers, and areas from others. The terms such as "first", "second", and "third" therefore do not limit the number or the order of the elements, members, regions, layers, areas, and the like.

An embodiment of the present invention is a FET which includes a first semiconductor layer including a first oxide semiconductor including indium as a main component, a second semiconductor layer including an i-type second oxide semiconductor having a wider bandgap than the first oxide semiconductor and is provided in contact with one surface of the first semiconductor layer, a conductive layer functioning as a gate electrode and adjacent to the other surface of the first semiconductor layer, and an insulating layer also functioning as a gate insulating film provided between the conductive layer and the first semiconductor layer. An energy difference between a vacuum level of the second oxide semiconductor and a Fermi level of the second oxide semiconductor is larger than an energy difference between a vacuum level of the first oxide semiconductor and a Fermi level of the first oxide semiconductor.

Another embodiment of the present invention is a FET which includes a first semiconductor layer including a first oxide semiconductor including indium as a main component, a second semiconductor layer including an i-type second oxide semiconductor including gallium as a main component and having a wider bandgap than the first oxide semiconductor and is provided in contact with one surface of the first semiconductor layer, a conductive layer also functioning as a gate electrode and adjacent to the other surface of the first semiconductor layer, and an insulating layer functioning as a gate insulating film provided between the conductive layer and the first semiconductor layer.

Another embodiment of the present invention is a FET which includes a first semiconductor layer including a first oxide semiconductor including indium as a main component, a second semiconductor layer including an i-type second oxide semiconductor in which the percentage of gallium to all elements other than oxygen is 80% or more in contact with one surface of the first semiconductor layer, and a conductive layer functioning as a gate electrode and adjacent to the other surface of the first semiconductor layer. An insulating layer also functioning as a gate insulating film is provided between the conductive layer and the first semiconductor layer.

In each of the above embodiments, the thickness of the first semiconductor layer is preferably more than or equal to 0.1 nm and less than or equal to 100 nm for a reason described later. The thickness of the second semiconductor layer is preferably more than or equal to 10 nm and less than or equal to 100 nm.

Further, an insulating film which includes an oxide including aluminum as a main component and having a bandgap of 8 eV or more may be provided in contact with a surface of the second semiconductor layer that is opposite to a surface in contact with the first semiconductor layer.

Further, an insulating film which includes an oxide including aluminum as a main component and having a bandgap of 8 eV or more may be provided in contact with a surface of the first semiconductor layer that is opposite to the surface in contact with the second semiconductor layer.

As the first oxide semiconductor, an oxide including indium as a main component can be used. For example, a material which includes elements selected from indium, gallium, aluminum, zinc, and oxygen at 90 at. % or more, preferably 95 at. % or more of the all elements and whose nominal composition formula is represented by $In_aGa_bAl_cZn_dO_e$ (here, a+b+c+d=2, a≥1, 2.5<e<3.5) may be used. Note that in order to increase the mobility, the concentration of indium is preferably high and a is preferably larger than 1.6. For the same purpose, the concentration of gallium is preferably higher than that of aluminum, and b is preferably larger than c, further preferably larger than 10c.

As the first oxide semiconductor, an oxide semiconductor including indium as a main component and including oxygen defects at $1 \times 10^{18}/cm^3$ or more can also be used.

As the second oxide semiconductor, a variety of oxides can be used. For example, a material which includes elements selected from indium, gallium, aluminum, zinc, and oxygen at 90 at. % or more, preferably 95 at. % or more of the all elements and whose nominal composition formula is represented by $In_aGa_bAl_cZn_dO_e$ (here, a+b+c+d=2, b≥1, 2.5<e<3.5) may be used. In order to form the i-type second oxide semiconductor, the concentration of indium or zinc is preferably lower than that of aluminum; c is preferably larger than a, further preferably larger than 10a, and c is preferably larger than d, further preferably larger than 10d. In addition, the bandgap of the second oxide semiconductor is preferably 6 eV or less.

In the case where the first oxide semiconductor and the second oxide semiconductor are the materials having the above-described compositions, the bandgap of the second oxide semiconductor is wider than that of the first oxide semiconductor.

Further, since the first oxide semiconductor with the above-described composition is n-type, the Fermi level is substantially the same level as the bottom of the conduction band. Therefore, the energy difference between the vacuum level and the Fermi level is almost the same as the electron affinity of the first oxide semiconductor.

On the other hand, since the second oxide semiconductor is i-type, the Fermi level is located substantially midway between the conduction band and the valence band. In the case where the first oxide semiconductor and the second oxide semiconductor are the materials having the above-described compositions, the following relation is satisfied: the work function of the second oxide semiconductor is higher than the electron affinity of the first oxide semiconductor.

In an embodiment of the present invention as illustrated in FIG. 1A, a first semiconductor layer 1 including the first oxide semiconductor is sandwiched between a second semiconductor layer 2 including the second oxide semiconductor and an insulating film 4 that also functions as a gate insulating film. Here, the first semiconductor layer 1 needs to be in contact with the second semiconductor layer 2. The first semiconductor layer 1 need not necessarily be in contact with the insulating film 4, but an effect described later can be obtained when the first semiconductor layer 1 is in contact with the insulating film 4.

Further, the insulating film 4 is sandwiched between a conductive layer 5 functioning as a gate and the first semiconductor layer 1 and also functions as a gate insulating film. In addition, a first electrode 3a and a second electrode 3b functioning as a source and a drain electrode are provided in contact with the first semiconductor layer 1.

As the first oxide semiconductor and the second oxide semiconductor, the above-described materials may be used. The thickness of the first semiconductor layer 1 may be more than or equal to 0.1 nm and less than or equal to 100 nm, and the thickness of the second semiconductor layer 2 may be more than or equal to 10 nm and less than or equal to 100 nm. As the insulating film 4, a material which includes elements selected from aluminum, boron, nitrogen, and oxygen at 90 at. % or more, preferably 98 at. % or more of the all elements and whose nominal composition formula is represented by $Si_aAl_bB_cN_dO_e$ (here, it is preferable to satisfy the following relations: 0.9<(4a+3b+3c)/(3d+2e)<1.1, b>a) may be used; for example, silicon oxide, silicon oxynitride, aluminum oxide, aluminum oxynitride, aluminum nitride, or the like may be used. In the case where the first semiconductor layer 1 is in contact with the insulating film 4, it is preferable to satisfy the following relation: b>5a.

As illustrated in FIG. 1B, the second semiconductor layer 2 may be sandwiched between the first semiconductor layer 1 and an insulating film 6. Here, the insulating film 6 is preferably in contact with the second semiconductor layer 2. As the insulating film 6, a material which includes elements selected from aluminum, boron, nitrogen, and oxygen at 90 at. % or more, preferably 98 at. % or more of the all elements and whose nominal composition formula is represented by $Si_aAl_bB_cN_dO_e$ (here, it is preferable to satisfy the following relations: 0.9<(4a+3b+3c)/(3d+2e)<1.1, b>10a, d<5e) may be used; for example, silicon oxide, silicon oxynitride, aluminum oxide, aluminum oxynitride, aluminum nitride, or the like may be used. By using a material satisfying this condition, the bandgap can be 8 eV or wider.

As illustrated in FIG. 1C, the first semiconductor layer 1 may be sandwiched between a second semiconductor layer 2a and a third semiconductor layer 2b including a third oxide semiconductor. A point of FIG. 1C different from points of FIG. 1A is that the third semiconductor layer 2b is inserted between the first semiconductor layer 1 and the insulating film 4. Here, the third semiconductor layer 2b need not necessarily be in contact with the insulating film 4 but needs to be in contact with the first semiconductor layer 1. As the third oxide semiconductor, a material suitable as the material of the second oxide semiconductor may be used, and the same material as that of the second oxide semiconductor may be used. Further, the thickness of the third semiconductor layer 2b may be more than or equal to 0.1 nm and less than or equal to 100 nm, preferably more than or equal to 0.1 nm and less than or equal to 20 nm.

In an embodiment of the present invention as illustrated in FIG. 2A, the first semiconductor layer 1 including the first oxide semiconductor is sandwiched between the second semiconductor layer 2 including the second oxide semiconductor and the insulating film 4 that also functions as a gate insulating film. Here, the first semiconductor layer 1 need not necessarily be in contact with the insulating film 4 but needs to be in contact with the second semiconductor layer 2.

The insulating film 4 is sandwiched between the conductive layer 5 functioning as a gate and the first semiconductor layer 1 and also functions as a gate insulating film. In addition, the first semiconductor layer 1 is in contact with regions having a conductivity that is increased by subjecting the first oxide semiconductor to doping treatment (doped regions 8a and 8b). The doped regions 8a and 8b are provided with the first electrode 3a and the second electrode 3b functioning as a source and a drain electrode.

Regions 7a and 7b formed by doping the second oxide semiconductor are provided in contact with the second semiconductor layer 2. The above-described materials may be used as materials of the first oxide semiconductor, the second oxide semiconductor, and the insulating film 4. Further, the thickness of the first semiconductor layer 1 and the thickness of the second semiconductor layer 2 may be in the above-described respective ranges.

As illustrated in FIG. 2B, the first electrode 3a and the second electrode 3b may be provided on surfaces of the doped regions 8a and 8b opposite to surfaces provided with the insulating film 4. If the doped regions 7a and 7b have enough conductivity, the first electrode 3a and the second electrode 3b may be provided in contact with the doped regions 7a and 7b. Further alternatively, a structure in which the first semiconductor layer 1 is sandwiched between the second semiconductor layer 2 and a third semiconductor layer (not shown) including a third oxide semiconductor may be employed.

Further alternatively, as illustrated in FIG. 2C, the second semiconductor layer 2 may be sandwiched between the first semiconductor layer 1 and the insulating film 6. Here, the insulating film 6 is preferably in contact with the second semiconductor layer 2. As the insulating film 6, the above-described material may be used.

In FIGS. 2A to 2C, the doped regions 7a, 7b, 8a, and 8b need not be provided if a specific condition is satisfied. For example, as illustrated in FIG. 2D, if the distance x between the first electrode 3a and the conductive layer 5 (or the distance between the second electrode 3b and the conductive layer 5) is 50 nm or less, the doped regions 7a, 7b, 8a, and 8b need not be provided.

The reason why a FET having a normally off characteristic or a characteristic close to the normally off characteristic is obtained by employing the above-described structures will be described with reference to FIGS. 3A to 3C. First, the junction between the first oxide semiconductor and the second oxide semiconductor which satisfy the above-described conditions will be considered. FIG. 3A shows a state (band diagram) of the first oxide semiconductor and a state (band diagram) of the second oxide semiconductor before they are joined together.

In FIG. 3A, the left diagram is a band diagram of the first oxide semiconductor, and the right diagram is that of the second oxide semiconductor. The first oxide semiconductor is typically an n-type semiconductor such as indium oxide, in which electrons serving as carriers are supplied to the conduction band, so that the Fermi level is located just below the conduction band. In the diagram, the energy difference between the conduction band and the Fermi level is exaggerated but is actually only several millivolts. It is analyzed that in some cases the Fermi level may be located above the bottom of the conduction band. The bandgap of indium oxide is approximately 3.7 eV.

The second oxide semiconductor is typically an i-type semiconductor having a wide bandgap, such as gallium oxide, in which almost no carriers exist, so that the Fermi level is located substantially midway between the valence band and the conduction band. It is observed that the bandgap of single-crystal gallium oxide is 4.8 eV, while the bandgap of a thin film of amorphous gallium oxide is 4.2 eV.

Here, the electron affinity (the energy difference between the vacuum level and the bottom of the conduction band) of the first oxide semiconductor is required to be higher than the electron affinity of the second oxide semiconductor. Preferably, the difference between the former electron affinity and the latter electron affinity is 0.3 eV or more. For example, the electron affinity of indium oxide is 4.8 eV, while the electron affinity of single-crystal gallium oxide is 3.5 eV and the electron affinity of amorphous gallium oxide is 4.3 eV to 4.5 eV. Thus, the electron affinity of indium oxide is higher than that of gallium oxide, and the difference therebetween is 0.3 eV or more.

In addition, the work function of the second oxide semiconductor is preferably higher than the electron affinity of the first oxide semiconductor. Preferably, the difference between the former work function and the latter electron affinity is 0.5 eV or more. For example, the work function of single-crystal gallium oxide is 5.5 eV and the work function of amorphous gallium oxide is 6.4 eV to 6.6 eV; both are higher than the electron affinity of indium oxide, and the difference therebetween is 0.7 eV or more.

When the first oxide semiconductor and the second oxide semiconductor which have different properties as described above are joined together, carriers move so as to make the Fermi levels of the first oxide semiconductor and the second oxide semiconductor located in the same level; as a result, the band is bent in a vicinity of the junction as illustrated in FIG. 3B. In other words, in the vicinity of the junction, the conduction band of the first oxide semiconductor becomes apart from the Fermi level and the valence band becomes closer to the Fermi level. Such a region in a state different from the original state is called a transition region. At a more remote place from the junction surface, the band state becomes closer to that of original characteristics of the first oxide semiconductor or the second oxide semiconductor.

In FIG. 3B, although the bend of the band is shown by a straight line only in the transition region, the influence of the carrier movement in practice reaches a considerable distance and the bend of the band is not linear. However, properties are significantly affected in a region near the junction surface. Thus, semiconductor properties in regions other than the transition region may be regarded as their original properties.

The width of the transition region depends on the electron affinities, the bandgaps, and the dielectric constants of the first oxide semiconductor and the second oxide semiconductor, the concentration of electrons in the first oxide semiconductor, and the like. For example, assuming that the first oxide semiconductor is indium oxide with an electron concentration of $1 \times 10^{18}/cm^3$ and the second oxide semiconductor is i-type gallium oxide, a region regarded as a transition region is a portion within about 50 nm on the first oxide semiconductor side from the junction surface.

This transition region is formed in the following manner: electrons in the vicinity of the junction surface in the first oxide semiconductor move and the electron concentration therein is reduced, so that the region is depleted. Thus, a portion close to the junction surface in the transition region has a low electron concentration and is quasi-i-type. In addition, since hardly any carriers (electrons) exist in the second oxide semiconductor, movement of electrons in that region can be ignored. The bend of the band is caused mainly in the first oxide semiconductor.

For example, in the example of FIG. 3B, the energy difference between the bottom of the conduction band of the first oxide semiconductor and the Fermi level at the junction surface is approximately 1.3 eV. This energy difference is large enough to ignore electrons thermally excited at room temperature. That is, the electron concentration is extremely low in the vicinity of the junction surface.

This bend of the band depends on the difference between the work function of the second semiconductor layer 2 and the electron affinity of the first semiconductor layer 1. It is preferable that the difference obtained by subtracting the latter electron affinity from the former work function be 0.5 eV or more, and further preferable that the difference between the former work function and the latter electron affinity be 1 eV or more.

In the case where the electron affinity of the first oxide semiconductor is higher than the electron affinity of the second oxide semiconductor, as illustrated in FIG. 3B, a discontinuous point (a gap or a step) is generated in the conduction band at the junction surface between the first oxide semiconductor and the second oxide semiconductor. This discontinuous point makes it difficult for electrons in the first oxide semiconductor to move into the second oxide semiconductor when the first oxide semiconductor is used as a channel of a FET. Accordingly, in the case where particularly the vicinity of the junction surface in the transition region is used as a channel, flow of electrons into the second oxide semiconductor need not be considered.

If it is assumed that a chemical reaction is not caused at the junction surface of this transition region, it can be considered that most properties of the first oxide semiconductor including field effect mobility except for low electron concentration are maintained. Accordingly, in the case of using a material having high field effect mobility as the first oxide semiconductor, a characteristic of low electron concentration and high field effect mobility in the transition region can be obtained.

In FIG. 3B, an example in which the first oxide semiconductor has an enough thickness is described. Even if the first oxide semiconductor is thinned to a thickness that is the same as or smaller than the thickness of the transition region, a difference is not made and a quasi-i-type region is formed in the vicinity of the junction surface.

In other words, by making the thickness of the first oxide semiconductor the same as or smaller than the thickness of the transition region, the concentration of electrons in the first oxide semiconductor can be reduced. In addition, high field effect mobility originating from the first oxide semiconductor can be obtained. Therefore, a FET manufactured using the above-described structure can achieve a high field effect mobility and a normally off characteristic or a characteristic close to the normally off characteristic.

FIG. 3C is a schematic band diagram along a cross section from Point A to Point B in the FET of FIG. 1B. The case to be described here is a case in which indium oxide is used as the first oxide semiconductor forming the first semiconductor layer 1, gallium oxide is used as the second oxide semiconductor forming the second semiconductor layer 2, aluminum oxide is used for the insulating film 4 and the insulating film 6, and tungsten is used for the conductive layer 5.

As shown in FIG. 3C, even when the first semiconductor layer 1 is formed using an n-type oxide semiconductor such as indium oxide, most part of the first semiconductor layer 1 can be a quasi-i-type region. The electron concentration in the quasi-i-type region is difficult to observe directly but is calculated to be $1 \times 10^{15}/cm^3$ or lower. Accordingly, the FET having such a structure can have a sufficiently high threshold voltage. In other words, a FET having a normally off characteristic or a characteristic close to the normally off characteristic can be obtained.

With careful attention to FIG. 3C, the bend of the band in the first semiconductor layer 1 is also observed in the vicinity of the interface with the insulating film 4. This is caused for the same reason why the transition region is generated near the junction surface between gallium oxide and indium oxide. In a FET having the bend of the band like this, carriers flow in the vicinity of the bottom of the conduction band. Accordingly, carriers flow in a portion that is some distance (typically a distance of more than or equal to 1 nm and less than or equal to 10 nm) from the interface between the first semiconductor layer 1 and the insulating film 4.

In a normal MISFET, a trap level or the like is generated at an interface between a gate insulating film and a semiconductor to reduce FET characteristics; however, the influence of the interface can be reduced with a structure in which carriers flow in a portion that is distant from the gate insulating film (a buried channel structure). For the same reason, in the FET having the structure whose band diagram is shown in FIG. 3C, the influence of the interface between the insulating film 4 and the first semiconductor layer 1 can be reduced.

This bend of the band depends on the difference between the work function of the insulating film 4 (since the insulating film 4 is normally regarded as being i-type, the work function thereof corresponds to the difference between the vacuum level and the Fermi level) and the electron affinity of the first semiconductor layer 1. For causing a bend like the one shown in FIG. 3C, it is preferable that the former work function be higher than the latter electron affinity, and further preferable that the difference between the former work function and the latter electron affinity be 1 eV or more.

The electron affinity of n-type indium oxide is approximately 4.8 eV, while the work function of aluminum oxide is 5.7 eV and the work function of silicon oxide is 5.1 eV. Thus, aluminum oxide is more appropriate for the above-described condition. Further, the work function of amorphous gallium oxide is 6.4 eV to 6.6 eV and higher than the electron affinity of indium oxide by 1.6 eV to 1.8 eV, which is preferable. Therefore, as illustrated in FIG. 1C, the first semiconductor layer 1 of indium oxide or the like may be sandwiched between the second semiconductor layer 2a and the third semiconductor layer 2b of gallium oxide or the like.

BRIEF DESCRIPTION OF DRAWINGS

In the accompanying drawings:

FIGS. 1A to 1C illustrate examples of a FET of the present invention;

BEST MODE FOR CARRYING OUT THE INVENTION

Figure 2A:
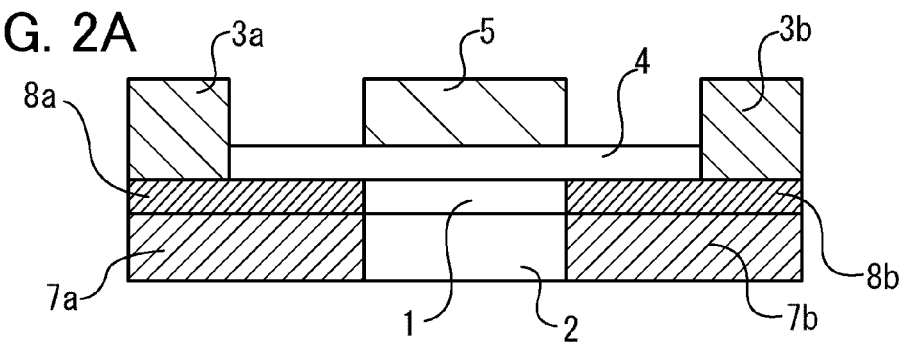
FIGS. 2A to 2D illustrate examples of a FET of the present invention.
Figure 2B:
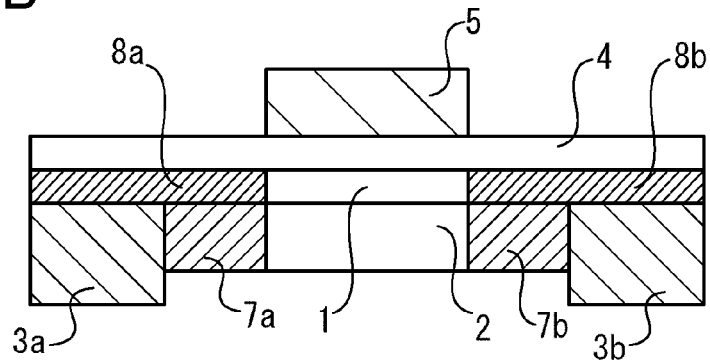
Figure 2C:
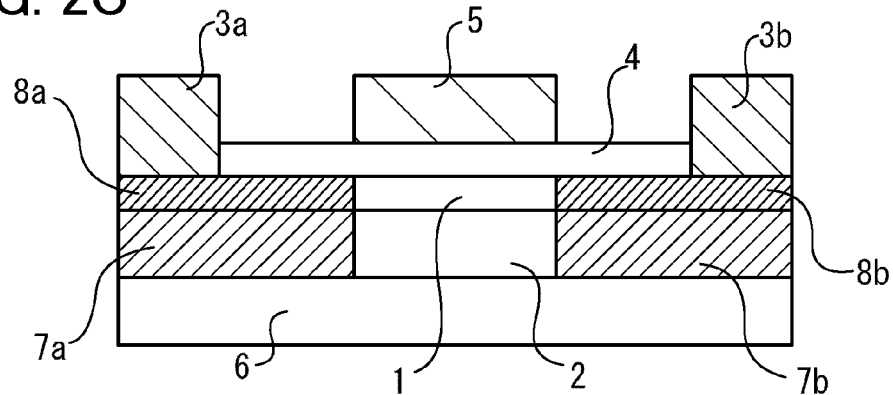
Figure 2D:
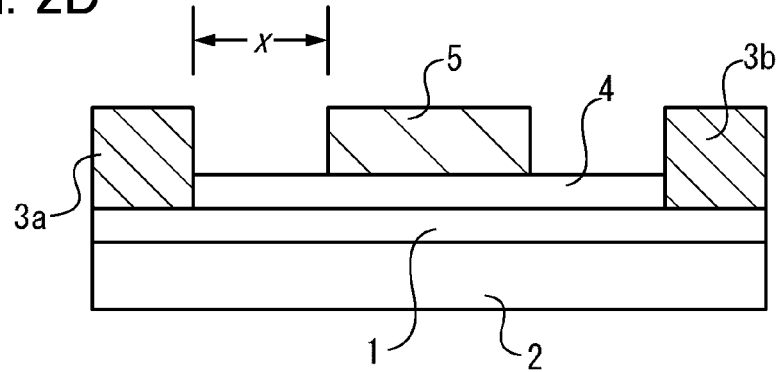
Figure 3A:
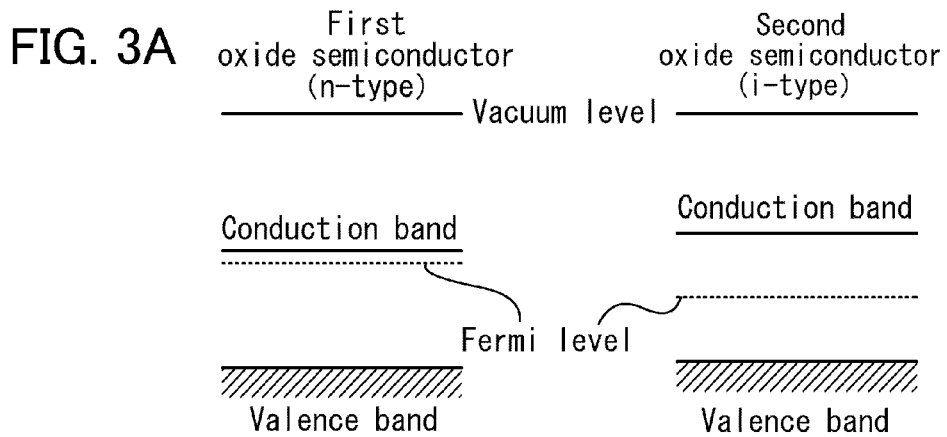
FIGS. 3A to 3C illustrate a principle of a FET of the present invention.
Figure 3B:
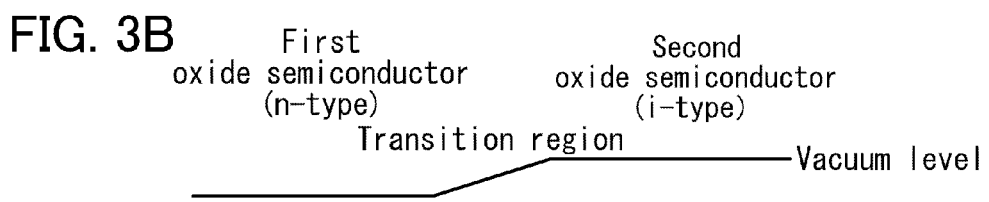
Figure 3C:
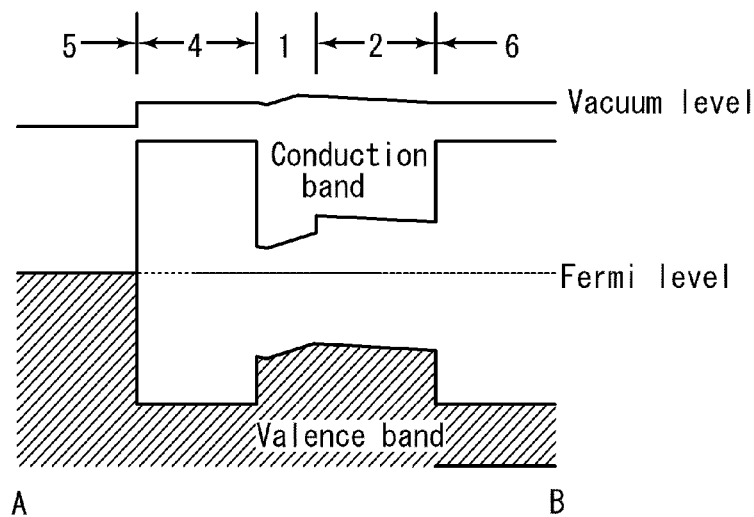

Embodiments will be described below with reference to drawings. However, the embodiments can be implemented in various modes. It will be readily understood by those skilled in the art that modes and details can be changed in various ways without departing from the spirit and scope of the present invention. Therefore, this invention is not interpreted as being limited to the description of the embodiments below. Note that in structures of the invention described below, the same portions or portions having similar functions are denoted by the same reference numerals throughout the drawings, and description thereof is not repeated.

Embodiment 1

Figure 4A:
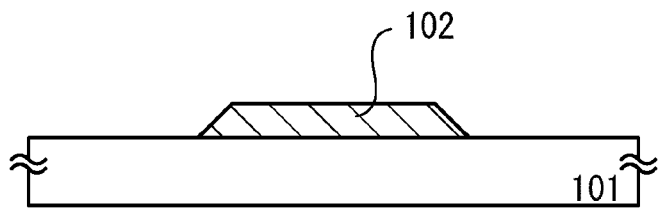
FIGS. 4A to 4F illustrate a manufacturing process of a FET of Embodiment 1.

In this embodiment, a manufacturing method of a FET will be described with reference to FIGS. 4A to 4F. First, as illustrated in FIG. 4A, a conductive layer 102 is formed over a substrate 101. A variety of substrates can be given as examples of the substrate 101, but the substrate 101 needs to have such a property as to withstand the subsequent treatment. Further, it is preferable that a surface of the substrate 101 have an insulating property. Accordingly, the substrate 101 is preferably an insulator alone; an insulator, metal, or semiconductor whose surface is provided with an insulating layer; or the like.

As the insulator, various kinds of glasses, sapphire, quartz, ceramics, plastics, or the like can be used. As the metal, aluminum, copper, stainless steel, silver, or the like can be used. As the semiconductor, silicon, germanium, silicon carbide, gallium nitride, or the like can be used. In this embodiment, barium borosilicate glass is used as the substrate 101.

Part of the conductive layer 102 functions as a gate, and a material of the conductive layer 102 may be a metal having a high work function such as platinum, gold, or tungsten. The conductive layer 102 may include one of the above-described materials alone or may have a multilayer structure where a portion in contact with a surface of a semiconductor layer provided later includes any of the above-described materials. In this embodiment, a 100-nm-thick tungsten film is formed by a sputtering method over a 100-nm-thick titanium film and etched to form the conductive layer 102.

Figure 4B:
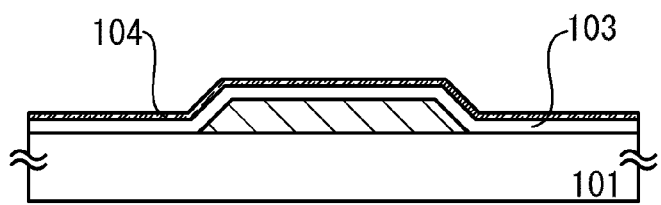

Next, as illustrated in FIG. 4B, an insulating film 103 and a first oxide semiconductor film 104 are formed. The insulating film 103 also functions as a gate insulating film. For example, silicon oxide, aluminum oxide, silicon oxynitride, aluminum nitride, aluminum oxynitride, hafnium oxide, lanthanum oxide, yttrium oxide, or the like may be used. The thickness of the insulating film 103 is mainly determined in consideration of the process circumstances and the voltage used for the FET but is preferably as small as possible for obtaining a normally-off FET characteristic or a characteristic close to the normally-off characteristic. For example, the thickness may be more than or equal to 10 nm and less than or equal to 200 nm. A CVD method or a sputtering method is used as a film formation method of the insulating film 103; it is preferable to reduce entry of hydrogen into the film as much as possible.

As a material of the first oxide semiconductor film 104, indium oxide is used. Of course, a different kind of oxide semiconductor including indium as a main component may be used. A film formation method of the first oxide semiconductor film 104 may be a sputtering method. Further, it is preferable to reduce entry of hydrogen into the film as much as possible. The thickness may be more than or equal to 10 nm and less than or equal to 50 nm. Note the first oxide semiconductor film 104 is preferably formed without exposure of a surface of the insulating film 103 to the air in terms of improving the cleanliness of an interface between the insulating film 103 and the first oxide semiconductor film 104.

A second oxide semiconductor film is formed over the first oxide semiconductor film 104. As a material of the second oxide semiconductor film, gallium oxide is used. Of course, a different kind of oxide semiconductor including gallium as a main component may be used. A film formation method of the second oxide semiconductor film may be a sputtering method. Further, it is preferable to reduce entry of hydrogen into the film as much as possible. By the analysis of the composition of the gallium oxide film formed by a sputtering method by Rutherford backscattering spectrometry, such a result that an excessive amount of oxygen exists in the nominal composition is obtained. That is, in $Ga_2O_{3+x}$, x is more than or equal to 0.01 and less than or equal to 0.15.

The thickness of the second oxide semiconductor film may be more than or equal to 10 nm and less than or equal to 100 nm. A film of a material that can serve as an etching stopper may be provided over the second oxide semiconductor film. Alternatively, an insulating film serving as an interlayer insulator may be provided over the second oxide semiconductor film.

Note that the second oxide semiconductor film is preferably formed without exposure of a surface of the first oxide semiconductor film 104 to the air in terms of improving the cleanliness of an interface between the first oxide semiconductor film 104 and the second oxide semiconductor film. Further, it is preferable that the insulating film 103, the first oxide semiconductor film 104, and the second oxide semiconductor film be successively formed in terms of improving the cleanliness of the interfaces therebetween.

Figure 4C:
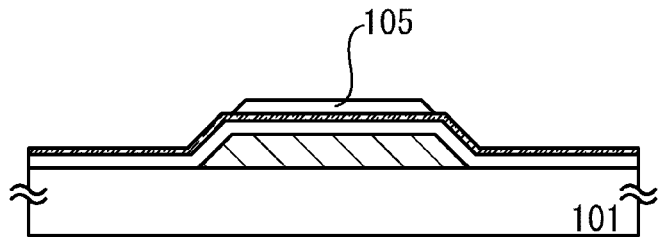

Then, the second oxide semiconductor film is selectively etched to be formed into an island-shaped second semiconductor layer 105. Part of the second semiconductor layer 105 is preferably formed over the conductive layer 102 as illustrated in FIG. 4C. Although not shown, another part of the second semiconductor layer 105 may be provided so as not to overlap with the conductive layer 102. Further, if the second semiconductor layer 105 is provided in a region where the conductive layer 102 crosses an upper-layer wiring, the second semiconductor layer 105 also functions as an interlayer insulator.

Alternatively, in the case where a thick insulating film is additionally formed over the second oxide semiconductor film and left over the second semiconductor layer 105, the thick insulating film can be used as an interlayer insulator in a region where the conductive layer 102 crosses an upper-layer wiring.

The second semiconductor layer 105 also functions as an etching stopper. Note that an alkaline solution (e.g., an ammonia peroxide mixture or the like) may be used in etching of the second oxide semiconductor film. Since the solubility of indium oxide in an alkaline solution is extremely low, in the case where indium oxide is used as the material of the first oxide semiconductor film 104, the second oxide semiconductor film can be selectively etched.

Figure 4D:
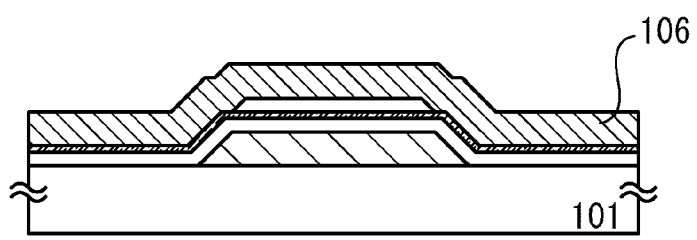

Then, a conductive film 106 is formed over the first oxide semiconductor film 104 and the second semiconductor layer 105 (see FIG. 4D). Since the conductive film 106 needs to function as a source and a drain electrode of a FET later, a material of the conductive film 106 is selected to fit the purpose. For example, titanium, molybdenum, titanium nitride, molybdenum nitride, and tungsten are given. The conductive film 106 may include one of the above-described materials alone or may have a multilayer structure where a portion in contact with the first semiconductor layer includes any of the above-described materials.

Then, the conductive film 106 is selectively etched, so that a conductive layer 106a and a conductive layer 106b are formed. This etching may be either wet etching or dry etching. In either case, it is necessary that the second semiconductor layer 105 is not excessively etched. For that purpose, an etching stopper is preferably provided over the second semiconductor layer 105. At the time of this etching, the first oxide semiconductor film 104 may be etched.

Figure 4E:
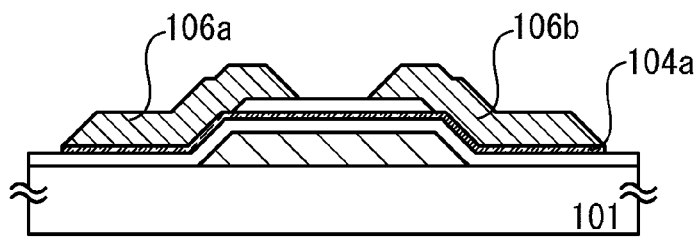

In the case where the first oxide semiconductor film 104 is not etched in the above etching, etching is continuously performed using a different etching method or the like. At this time, such a condition as to make the etching rate of the first oxide semiconductor film 104 higher than that of the second semiconductor layer 105 is employed. For example, if wet etching is employed as this etching, an etchant containing an oxalic acid or a phosphoric acid may be used. In this manner, a first semiconductor layer 104a having an island shape is formed as illustrated in FIG. 4E.

Figure 4F:
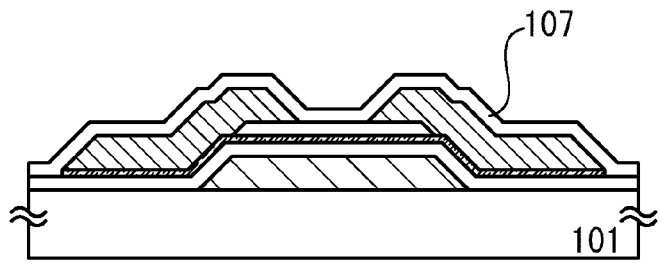

Then, as illustrated in FIG. 4F, an oxide insulating film 107 is formed over an entire surface. As a material of the oxide insulating film 107, silicon oxide, aluminum oxide, silicon oxynitride, aluminum nitride, aluminum oxynitride, hafnium oxide, lanthanum oxide, yttrium oxide, or the like may be used. The thickness can be more than or equal to 10 nm and less than or equal to 1 μm. In the case where the oxide insulating film 107 needs to function as a protective film, it is preferable to form the oxide insulating film 107 thick.

Embodiment 2

Figure 5A:
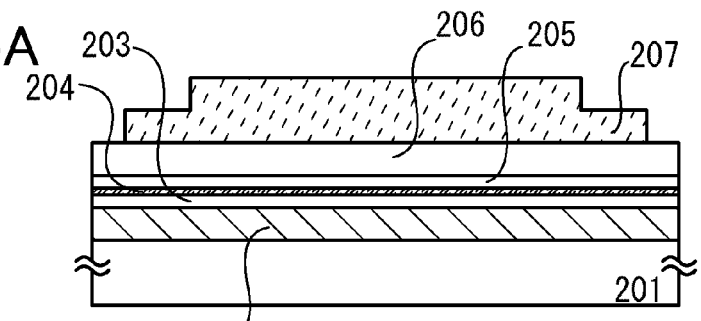
FIGS. 5A to 5E illustrate a manufacturing process of a FET of Embodiment 2.

In this embodiment, a manufacturing method of a FET will be described with reference to FIGS. 5A to 5E. As illustrated in FIG. 5A, a conductive film 202, an insulating film 203, a first oxide semiconductor film 204, a second oxide semiconductor film 205, and an oxide insulating film 206 are stacked over a substrate 201. Formation of these films is preferably performed successively without exposure to the air on the way in order to keep interfaces of the films clean. In addition, successive film formation is also effective in order to make the hydrogen concentration in the multi-layer films lower than or equal to $1 \times 10^{18}$ atoms/cm$^3$, preferably lower than or equal to $1 \times 10^{16}$ atoms/cm$^3$.

The substrate 201, the conductive film 202, the insulating film 203, the first oxide semiconductor film 204, the second oxide semiconductor film 205, and the oxide insulating film 206 may be formed using materials, thicknesses, and formation methods that are described in Embodiment 1 as being suitable for the substrate 101, the conductive layer 102, the insulating film 103, the first oxide semiconductor film 104, the second oxide semiconductor film, and the oxide insulating film 107, respectively.

Then, a resist is applied over the oxide insulating film 206, and a resist mask 207 having two levels of thicknesses is formed using a multi-tone mask as illustrated in FIG. 5A.

Figure 5B:
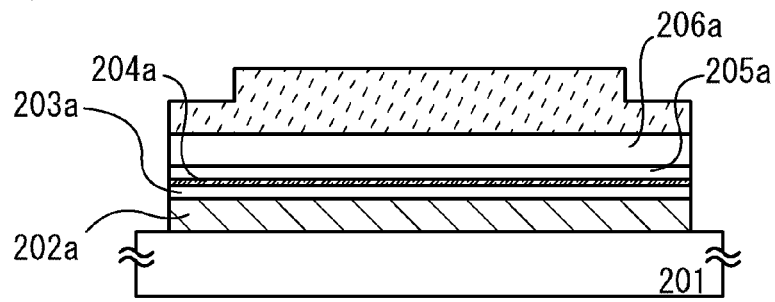

With the use of the resist mask 207, the conductive film 202, the insulating film 203, the first oxide semiconductor film 204, the second oxide semiconductor film 205, and the oxide insulating film 206 are etched, so that a conductive layer 202a, an insulating layer 203a, a first semiconductor layer 204a, a second semiconductor layer 205a, and an oxide insulating layer 206a are formed (see FIG. 5B). An anisotropic dry etching method is preferable as this etching, but a wet etching method or an isotropic dry etching method may also be used.

Figure 5C:
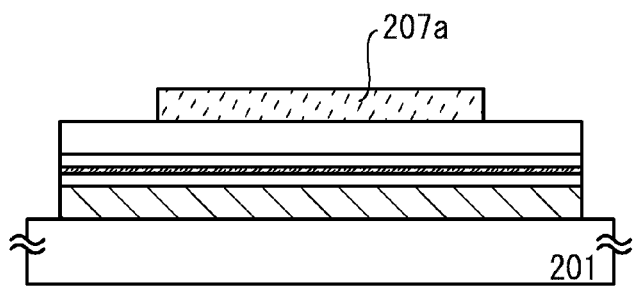

Next, the resist mask 207 is subjected to ashing to be reduced in thickness, so that a resist mask 207a is formed (see FIG. 5C).

Figure 5D:
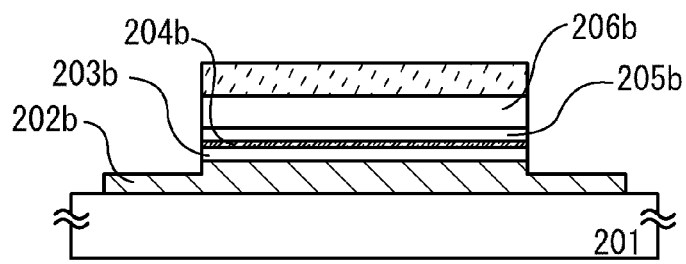

Then, with the use of the resist mask 207a, the insulating layer 203a, the first semiconductor layer 204a, the second semiconductor layer 205a, and the oxide insulating layer 206a are etched, so that an insulating layer 203b, a first semiconductor layer 204b, a second semiconductor layer 205b, and an oxide insulating layer 206b which each have almost the same shape and form an island shape are formed (see FIG. 5D). As this etching, an anisotropic dry etching method is preferably used, but a wet etching method or an isotropic dry etching method may also be used.

The conductive layer 202a need not necessarily be etched; however, it is difficult to find a condition under which the conductive layer 202a is not etched at all at the time of the above-described etching. Accordingly, although the etched amount varies, the conductive layer 202a is etched into a conductive layer 202b having a surface part of which is etched. In particular, in the case where a sufficiently high etching selectivity cannot be obtained, it is preferable to form the conductive film 202 sufficiently thick. For example, the thickness of the conductive film 202 may be more than or equal to 200 nm and less than or equal to 1 μm.

The thickness of the conductive film 202 may be set to be more than or equal to 50% and less than or equal to 500% of the sum of the thicknesses of the insulating film 203, the first oxide semiconductor film 204, the second oxide semiconductor film 205, and the oxide insulating film 206. When the thickness of the conductive film 202 has a sufficient thickness in this manner, a necessary thickness can be secured even if overetching is caused to some extent.

In this embodiment, even if the conductive film 202 is thick, the influence on the shape of a thin film to be stacked later is small, and there is rather an advantage that the resistance of the conductive layer 202b is reduced.

Then, the resist mask 207a is removed. For this removal, a stripper may be used; the concentration of hydrogen ions in the selected stripper needs to be appropriate because gallium oxide has a property of being soluble in an alkaline solution.

Alternatively, the resist mask 207a may be removed by an ashing method. In the case of employing an ashing method, a residue may become a problem. However, in this embodiment, even if a residue is generated, the residue exists over the oxide insulating layer 206b. Therefore, by making the oxide insulating layer 206b sufficiently thick, an influence on FET characteristics can be reduced. Since the oxide insulating layer 206b has a function as an interlayer insulator as well in this embodiment, it is particularly preferable to form the oxide insulating layer 206b thick.

Then, an interlayer insulator 208 having a flat surface is formed, and the interlayer insulator 208, the oxide insulating layer 206b, and the second semiconductor layer 205b are etched to form an opening reaching the first semiconductor layer 204b. The opening is provided so as to overlap with the insulating layer 203b. The opening is preferably provided to have a perimeter that is 200 nm or more, preferably 1 μm or more away from a perimeter of the insulating layer 203b.

The opening can be formed by either a wet etching method or a dry etching method. Note that in either case of etching, the first semiconductor layer 204b may be chemically influenced by the etching.

Next, a conductive film is formed and etched into a desired shape, so that a conductive layer 209a and a conductive layer 209b are formed. The conductive film may be formed using a material, a thickness, and a film formation method that are suitable for the conductive film 106 of Embodiment 1.

Figure 5E:
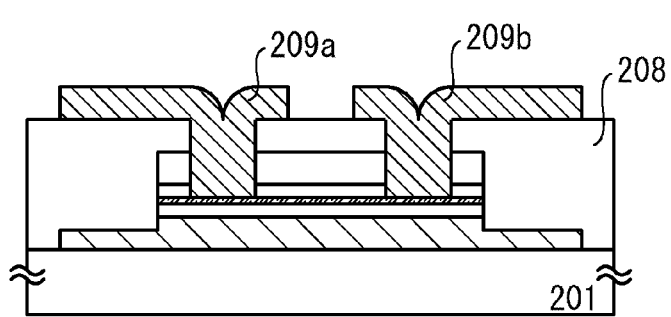

Portions in contact with the first semiconductor layer 204b of the conductive layers 209a and 209b function as a source electrode and a drain electrode of a FET. This stage is illustrated in FIG. 5E. The distance between the portions in contact with the first semiconductor layer 204b of the conductive layers 209a and 209b is the channel length of the FET.

Note that in the case where high temperature treatment of 400° C. or higher is performed after the conductive layers 209a and 209b are formed, an element included in the conductive layers 209a and 209b may diffuse into the first semiconductor layer 204b and adversely affect characteristics of the first semiconductor layer 204b. Accordingly, after the conductive layers 209a and 209b are formed, it is preferable to avoid such high-temperature treatment. Note that since the conductive layers 209a and 209b are formed at the final stage of the manufacturing process of the FET, high-temperature treatment is hardly necessary after the formation of the conductive layers 209a and 209b.

Moreover, in many cases, characteristics of an edge region (a perimeter region) of the first semiconductor layer 204b are not preferable. This region often has higher conductivity than the other region and can be a factor of a leak current in a FET having a shape like the one illustrated in FIG. 4F. This is because in the FET having the shape like the one illustrated in FIG. 4F, an edge region of the first semiconductor layer 104a is in contact with the conductive layer 106a and the conductive layer 106b functioning as a source and a drain electrode.

However, in the FET illustrated in FIG. 5E, the conductive layers 209a and 209b functioning as a source and a drain electrode do not overlap with the edge region of the first semiconductor layer 204b as described above. Therefore, if the edge region of the first semiconductor layer 204b has a high conductivity, a leakage current does not flow between the conductive layers 209a and 209b. Thus, a FET having a sufficiently small off-state current can be obtained.

As is clear from FIG. 5E, the first semiconductor layer 204b is formed over a flat surface. For example, a step of a semiconductor layer as in the first semiconductor layer 104a of FIG. 4F affects FET characteristics. Since elements having such a step are difficult to be formed uniformly, this may cause a variation in FET characteristics.

For example, in FIG. 4E, the conductive layers 106a and 106b are provided to be bilaterally symmetrical about the first semiconductor layer 104a and the conductive layer 102; however, it is difficult to form all the elements so as to have such a shape. Even if a slight parallel displacement of the conductive layers 106a and 106b to the right side (or the left side) in the drawing occurs owing to an error in mask alignment, positional relations between the conductive layers 106a and 106b and a curved portion of the first semiconductor layer 104a become different, which may change characteristics of the FET in some cases. That is, variation in FET characteristics may arise.

In particular, when the first semiconductor layer contains a certain crystalline component, the variation tends to be large. This is because there are large differences in the crystal orientation, size of crystals, and the like between a flat portion and a curved portion of the first semiconductor layer. In the case of indium oxide, such a crystalline component is generated even when indium oxide is annealed at a relatively low temperature.

By contrast, it is easy to form a flat semiconductor layer uniformly over a flat surface. Even when a slight parallel displacement of the conductive layers 209a and 209b in FIG. 5E to the right side (or the left side) in the drawing occurs owing to an error in mask alignment, positional relations between the first semiconductor layer 204b and the conductive layers 209a and 209b are not changed. That is, variation in FET characteristics is less.

Therefore, variation of characteristics of the FET described in this embodiment is less than that of the FET including a large step of a semiconductor layer. Such a FET is favorably used in a circuit whose variation in threshold voltage needs to be small.

For example, in an active-matrix organic electroluminescent display device, variation in threshold voltage of driving transistors is preferably small in order to prevent display unevenness. In addition, a FET exhibiting high field effect mobility is preferable as a driving transistor in order to reduce resistance loss. In order to achieve such objects, a FET which has the structure illustrated in FIG. 5E and is manufactured so as to include an oxide semiconductor including indium as a main component in a semiconductor layer is suitable. Such a FET exhibits, for example, a field effect mobility of 50 cm$^2$/Vs or higher, preferably 70 cm$^2$/Vs or higher.

Further in this embodiment, the first semiconductor layer 204b and the insulating layer 203b are provided over flat surfaces; there is no need to consider step coverage or the like of these thin films. Accordingly, the first semiconductor layer 204b and the insulating layer 203b can be made as thin as possible.

Thinning of the first semiconductor layer 204b and the insulating layer 203b is effective for suppressing a negative shift of the threshold voltage of the FET and reducing the off-state current. In particular, in a FET having a channel length of 0.3 μm or less, the first semiconductor layer 204b and the insulating layer 203b are required to be thin.

In order to suppress the negative shift of the threshold voltage of the FET, the following relation needs to be satisfied: (the channel length)>5×(the thickness of the first semiconductor layer 204b+(the thickness of the insulating layer 203b)×(the dielectric constant ratio)). Here, the dielectric constant ratio is a value obtained by dividing the dielectric constant of the first semiconductor layer 204b by the dielectric constant of the insulating layer 203b.

For example, in the case where the channel length is 0.3 μm, the first semiconductor layer 204b is formed of indium oxide (dielectric constant: 18) to have a thickness of 30 nm, and the insulating layer 203b is formed of silicon oxide (dielectric constant: 4), the thickness of the insulating layer 203b needs to be 10 nm or less.

It is difficult to form such a thin film over an uneven surface with favorable coverage, resulting in yield reduction. On the other hand, it is easy to form such a thin film over a flat surface. In this respect, a FET of the structure described in this embodiment is advantageous.

Note that according to the manufacturing process described in this embodiment, the number of times of mask alignment is 2, which is less than that in the method illustrated in FIGS. 4A to 4F (3 times of mask alignment). Thus, the manufacturing process described in this embodiment is effective in reducing the possibility of defects caused by misalignment and improving yields.

Embodiment 3

Figure 6A:
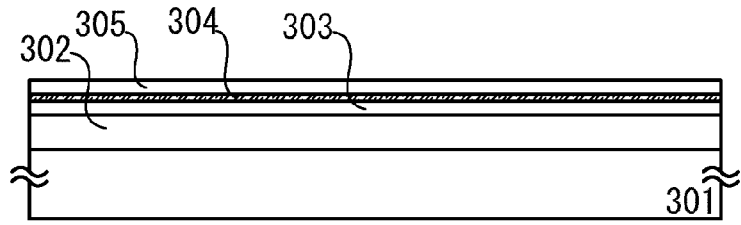
FIGS. 6A to 6D illustrate a manufacturing process of a FET of Embodiment 3.
Figure 6B:
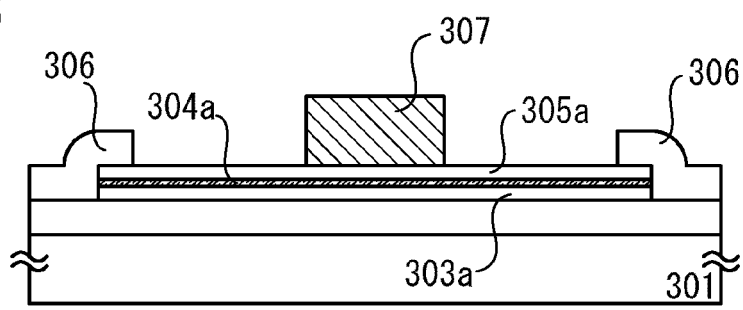

In this embodiment, a manufacturing method of a FET will be described with reference to FIGS. 6A to 6D. As illustrated in FIG. 6A, an oxide insulating film 302, a second oxide semiconductor film 303, a first oxide semiconductor film 304, and an insulating film 305 are stacked over a substrate 301. Formation of theses films is preferably performed successively without exposure to the air on the way in order to keep interfaces of the films clean.

For example, a silicon wafer may be used as the substrate 301, a 200-nm-thick silicon oxide film may be used as the oxide insulating film 302, a 50-nm-thick gallium oxide film may be used as the second oxide semiconductor film 303, a 1-nm-thick indium oxide film may be used as the first oxide semiconductor film 304, and a 2-nm-thick silicon oxide film may be used as the insulating film 305. The oxide insulating film 302 may be formed by performing thermal oxidation on the substrate 301. The second oxide semiconductor film 303, the first oxide semiconductor film 304, and the insulating film 305 may be formed by atomic layer deposition (ALD). These films may be successively formed in a deposition apparatus.

Then, the second oxide semiconductor film 303, the first oxide semiconductor film 304, and the insulating film 305 are selectively etched into a second semiconductor layer 303a, a first semiconductor layer 304a, and an insulating layer 305a.

Further, a film of silicon oxide or the like having a thickness of more than or equal to 100 nm and less than or equal to 500 nm is formed as an insulator 306 so as to cover a perimeter region of the insulating layer 305a. Then, a conductive layer 307 is formed (see FIG. 5B). A material and a formation method of the conductive layer 307 may be determined by reference to the description of the conductive layer 102 in Embodiment 1. The thickness of the conductive layer 307 is preferably more than or equal to twice the sum of the thickness of the first semiconductor layer 304a and the thickness of the insulating layer 305a.

Although not shown, the conductive layer 307 climbs over the insulator 306 in a region over the perimeter region of the insulating layer 305a. Therefore, the conductive layer 307 is not in direct contact with the first semiconductor layer 304a.

Since the conductive layer 307 serves as a gate of a FET, the width of the conductive layer 307 determines the channel length of the FET. Here, the negative shift of the threshold voltage can be suppressed and off-state current can be reduced when the width of the conductive layer 307 is 5 times or more, preferably 10 times or more the sum of the thickness of the first semiconductor layer 304a and the thickness of the insulating layer 305a multiplied by the dielectric constant ratio between the first semiconductor layer 304a and the insulating layer 305a (the dielectric constant of the first semiconductor layer 304a/the dielectric constant of the insulating layer 305a).

For example, since the dielectric constant of indium oxide is approximately 18 and the dielectric constant of silicon oxide is approximately 4 (these values vary delicately with the film formation method), the dielectric constant ratio is approximately 4.5. By using the above-described thicknesses in the calculation, the width of the conductive layer 307 is obtained to be preferably 5 times or more, further preferably 10 times or more of the value obtained by the following formula: (the thickness of the first semiconductor layer 304a (1 nm))+(the thickness of the insulating layer 305a (2 nm))×(the dielectric constant ratio (4.5)). That is, the width of the conductive layer 307 is preferably more than or equal to 50 nm, and further preferably more than or equal to 100 nm.

As is apparent from the above-described calculation, the width of the conductive layer 307 can be small if a high dielectric constant material is used for the insulating layer 305a. For example, the width of the conductive layer 307 can be set to 10 nm or more, preferably 20 nm or more if a material having a dielectric constant of approximately 30 such as hafnium oxide is used as a material of the insulating layer 305a.

Unlike a normal MOSFET in which a silicon semiconductor is used, even in the case where a different kind of material such as hafnium oxide is formed in contact with an oxide semiconductor including indium as a main component, FET characteristics are little affected by a defect level at an interface between the first semiconductor layer 304a and the insulating layer 305a. In particular, in the case of using hafnium oxide, since the work function thereof (5.7 eV) is higher than the electron affinity of indium oxide (4.8 eV), the band of indium oxide is bent and a buried-channel-like shape is obtained. Accordingly, the influence of the interface between the first semiconductor layer 304a and the insulating layer 305a becomes less.

Figure 6C:
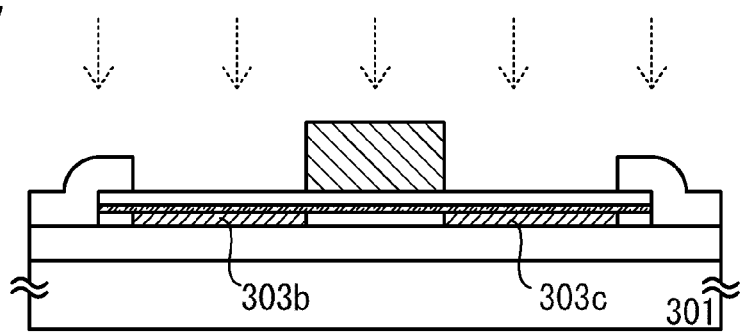
Figure 6D:
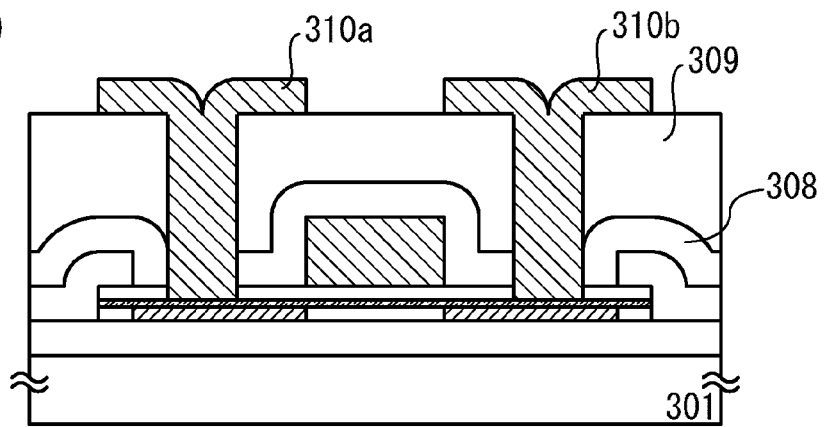
Figure 7A:
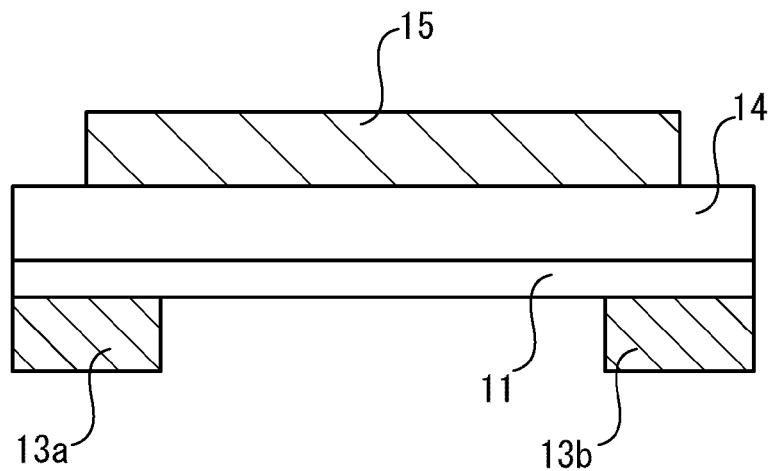
FIGS. 7A and 7B illustrate examples of a conventional FET.
Figure 7B:
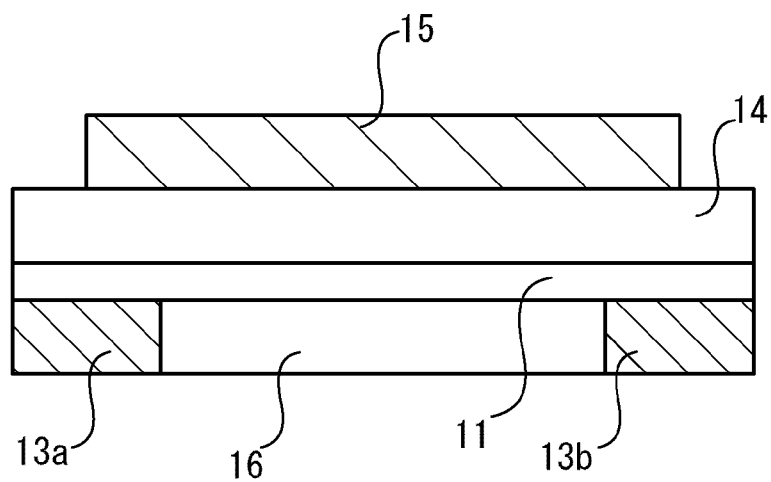

Next, irradiation with ions having a high reducing property is performed (see FIG. 6C). The peak of ion energy at this time may be set to be positioned between the interface of the first semiconductor layer 304a and the second semiconductor layer 303a and the interface of the second semiconductor layer 303a and the oxide insulating film 302. Under this condition, ions do not pass through the conductive layer 307; accordingly, ions are introduced into the first semiconductor layer 304a and the second semiconductor layer 303a in a self-aligned manner using the conductive layer 307 as a mask.

If ions having a high reducing property are introduced into an oxide semiconductor including indium oxide as a main component, the ions are combined with oxygen, so that the oxide semiconductor is reduced. As a result, the electron concentration in a portion into which the ions are introduced is increased, so that conductivity is increased. The amount of ions introduced may be determined in accordance with the desired conductivity. The ions may be included in the first semiconductor layer 304a at $2 \times 10^{20}/cm^3$ or more.

As the ions having a high reducing property, ions of an element an oxide of which has a stronger binding force than indium oxide, such as boron, carbon, phosphorus, silicon, aluminum, or gallium, may be used. Among them, phosphorus and boron are easy to be used because they are used in a normal semiconductor process.

It is to be noted that the hydrogen is not introduced at the same time as the introduction of the ions. Thus, it is not preferable to use a hydride (e.g., diborane ($B_2H_6$) or phosphine ($PH_3$)) as an ion source. If hydrogen is introduced into the oxide semiconductor, the electron concentration is increased; however, the hydrogen moves in the oxide semiconductor and causes variation in FET characteristics, which leads to lower reliability. It is desirable that the hydrogen concentration in the ions be 1 at. % or less.

At the time of this ion introduction, ions are introduced into the second semiconductor layer 303a as well, so that gallium oxide is also reduced by the ions. Thus, regions having high conductivity 303b and 303c are formed in the second semiconductor layer 303a.

Here, if the thickness of the second semiconductor layer 303a (that is, the thickness of the second oxide semiconductor film 303) is too small, electric resistance cannot be reduced sufficiently even when the conductivity of the second semiconductor layer 303a is high. Therefore, the thickness of the second semiconductor layer 303a is preferably set to an appropriate thickness. The concentration of ions introduced into the second semiconductor layer 303a is preferably higher than that of ions introduced into the first semiconductor layer 304a to form a degenerated semiconductor. For example, ions may be included in the second semiconductor layer 303a at $5 \times 10^{20}/cm^3$ or more.

Next, for example, a protective insulating film 308 is formed by a plasma CVD method or the like using silicon nitride or the like to have a thickness of more than or equal to 200 nm and less than or equal to 1 μm. Here, the protective insulating film 308 may be a film that gives such a stress as to compress the first semiconductor layer 304a. With this stress, the first semiconductor layer is compressed and the distance between indium atoms in indium oxide can be shortened. As a result, a transport property of the first semiconductor layer (typically, field effect mobility) is improved.

Further, silicon oxide or the like is deposited to a thickness of more than or equal to 200 nm and less than or equal to 2 μm, and planarized by chemical mechanical polishing to obtain an interlayer insulator 309 having a flat surface. Further, the interlayer insulator 309, the protective insulating film 308, and the insulating layer 305a are etched to form opening reaching the first semiconductor layer 304a or the second semiconductor layer 303a. Then, a conductive layer 310a and a conductive layer 310b are formed to fill the openings (see FIG. 6D).

As described above, since the first semiconductor layer 304a is 1 nm thick, the openings may penetrate through the first semiconductor layer 304a due to overetching. However, since the conductivity of the second semiconductor layer 303a is enough even in such a case, the conductive layers 310a and 310b function as electrodes of the FET. In other words, current flows through the following route: the conductive layer 310a, the region having high conductivity 303b in the second semiconductor layer, the first semiconductor layer 304a, the region having high conductivity 303c of the second semiconductor layer, and the conductive layer 310b.

Also for the purpose of preventing overetching of the second semiconductor layer 303a, the second semiconductor layer 303a preferably has an appropriate thickness. Although the second semiconductor layer 303a has a thickness of 50 nm in this embodiment, the thickness of the second semiconductor layer 303a is preferable as long as it is 30 nm or more.

Embodiment 4

The semiconductor devices described in Embodiments 1 to 3 can be used in a variety of electronic devices. For example, they can be used in display devices such as liquid crystal displays, EL displays, and FE (field emission) displays; driver circuits of such display devices; driver circuits of image sensors; semiconductor memories; microprocessors; and the like. Further, the semiconductor devices described in Embodiments 1 to 3 can be used in a variety of electronic devices including any of such display devices, for example in television devices, personal computers, communication devices such as mobile phones, electronic notebooks, and portable music players.

EXPLANATION OF REFERENCE

1: first semiconductor layer, 2: second semiconductor layer, 2a: second semiconductor layer, 2b: third semiconductor layer, 3a: first electrode, 3b: second electrode, 4: insulating film, 5: conductive layer, 6: insulating film, 7a: doped region, 7b: doped region, 8a: doped region, 8b: doped region, 11: semiconductor layer, 13a: source electrode, 13b: drain electrode, 14: gate insulating film, 15: gate, 16: protective insulating film, 101: substrate, 102: conductive layer, 103: insulating film, 104: first oxide semiconductor film, 104a: first semiconductor layer, 105: second semiconductor layer, 106: conductive film, 106a: conductive layer, 106b: conductive layer, 107: oxide insulating film, 201: substrate, 202: conductive film, 202a: conductive layer, 202b: conductive layer, 203: insulating film, 203a: insulating layer, 203b: insulating layer, 204: first oxide semiconductor film, 204a: first semiconductor layer, 204b: first semiconductor layer, 205: second oxide semiconductor film, 205a: second semiconductor layer, 205b: second semiconductor layer, 206: oxide insulating film, 206a: oxide insulating layer, 206b: oxide insulating layer, 207: resist mask, 207a: resist mask, 208: interlayer insulator, 209a: conductive layer, 209b: conductive layer, 301: substrate, 302: oxide insulating film, 303: second oxide semiconductor film, 303a: second semiconductor layer, 303b: region having high conductivity, 303c: region having high conductivity, 304: first oxide semiconductor film, 304a: first semiconductor layer, 305: insulating film, 305a: insulating layer, 306: insulator, 307: conductive layer, 308: protective insulating film, 309: interlayer insulator, 310a: conductive layer, 310b: conductive layer.

This application is based on Japanese Patent Application serial no. 2010-136705 filed with Japan Patent Office on Jun. 16, 2010, the entire contents of which are hereby incorporated by reference.

The invention claimed is:

1. A field effect transistor comprising:
a first semiconductor layer including a first oxide semiconductor;
a second semiconductor layer including a second oxide semiconductor and being in contact with a first surface of the first semiconductor layer;
a third semiconductor layer including a third oxide semiconductor and being in contact with a second surface of the first semiconductor layer; and
a source electrode and a drain electrode which are in contact with the first surface of the first semiconductor layer,
wherein a side surface of each of the source electrode and the drain electrode is in contact with the second semiconductor layer, and
wherein a bandgap of each of the second oxide semiconductor and the third oxide semiconductor is wider than a bandgap of the first oxide semiconductor.

2. The field effect transistor according to claim 1,
wherein the first oxide semiconductor comprises at least indium, and
wherein a percentage of indium to all elements having an atomic number of 11 or more is 50 at. % or more in the first oxide semiconductor.

3. The field effect transistor according to claim 1,
wherein each of the second oxide semiconductor and the third oxide semiconductor comprises at least gallium, and
wherein a percentage of gallium to all elements having an atomic number of 11 or more is 50 at. % or more in each of the second oxide semiconductor and the third oxide semiconductor.

4. The field effect transistor according to claim 1, wherein each of the second oxide semiconductor and the third oxide semiconductor is an i-type oxide semiconductor.

5. The field effect transistor according to claim 1, wherein the bandgap each of the second oxide semiconductor and the third oxide semiconductor is 6 eV or less.

6. The field effect transistor according to claim 1, further comprising:
a conductive layer adjacent to the third semiconductor layer; and
an insulating film between the conductive layer and the third semiconductor layer.

7. A field effect transistor comprising:
a first semiconductor layer including a first oxide semiconductor;
a second semiconductor layer including a second oxide semiconductor and being in contact with a first surface of the first semiconductor layer;
a third semiconductor layer including a third oxide semiconductor and being in contact with a second surface of the first semiconductor layer; and
a source electrode and a drain electrode which are in contact with the first surface of the first semiconductor layer,
wherein a side surface of each of the source electrode and the drain electrode is in contact with the second semiconductor layer,
wherein a bandgap of each of the second oxide semiconductor and the third oxide semiconductor is wider than a bandgap of the first oxide semiconductor,
wherein each of the second oxide semiconductor and the third oxide semiconductor comprises at least gallium and indium, and
wherein a percentage of gallium to all elements other than oxygen is 80 at. % or more in each of the second oxide semiconductor and the third oxide semiconductor.

8. The field effect transistor according to claim 7,
wherein the first oxide semiconductor comprises at least indium, and
wherein a percentage of indium to all elements having an atomic number of 11 or more is 50 at. % or more in the first oxide semiconductor.

9. The field effect transistor according to claim 7, wherein each of the second oxide semiconductor and the third oxide semiconductor is an i-type oxide semiconductor.

10. The field effect transistor according to claim 7, wherein the bandgap each of the second oxide semiconductor and the third oxide semiconductor is 6 eV or less.

11. The field effect transistor according to claim 7, further comprising:
a conductive layer adjacent to the third semiconductor layer; and
an insulating film between the conductive layer and the third semiconductor layer.

12. A field effect transistor comprising:
a first semiconductor layer including a first oxide semiconductor;
a second semiconductor layer including a second oxide semiconductor and being in contact with a first surface of the first semiconductor layer;
a third semiconductor layer including a third oxide semiconductor and being in contact with a second surface of the first semiconductor layer; and
a source electrode and a drain electrode which are in contact with the first surface of the first semiconductor layer,
wherein a side surface of each of the source electrode and the drain electrode is in contact with the second semiconductor layer,
wherein a bandgap of each of the second oxide semiconductor and the third oxide semiconductor is wider than a bandgap of the first oxide semiconductor,
wherein an energy difference between a vacuum level of the second oxide semiconductor and a Fermi level of the second oxide semiconductor is larger than an energy difference between a vacuum level of the first oxide semiconductor and a Fermi level of the first oxide semiconductor, and
wherein an energy difference between a vacuum level of the third oxide semiconductor and a Fermi level of the third oxide semiconductor is larger than the energy difference between the vacuum level of the first oxide semiconductor and the Fermi level of the first oxide semiconductor.

13. The field effect transistor according to claim 12,
wherein the first oxide semiconductor comprises at least indium, and
wherein a percentage of indium to all elements having an atomic number of 11 or more is 50 at. % or more in the first oxide semiconductor.

14. The field effect transistor according to claim 12,
wherein each of the second oxide semiconductor and the third oxide semiconductor comprises at least gallium, and
wherein a percentage of gallium to all elements having an atomic number of 11 or more is 50 at. % or more in each of the second oxide semiconductor and the third oxide semiconductor.

15. The field effect transistor according to claim 12, wherein each of the second oxide semiconductor and the third oxide semiconductor is an i-type oxide semiconductor.

16. The field effect transistor according to claim 12, wherein the bandgap each of the second oxide semiconductor and the third oxide semiconductor is 6 eV or less.

17. The field effect transistor according to claim 12, further comprising:
a conductive layer adjacent to the third semiconductor layer; and
an insulating film between the conductive layer and the third semiconductor layer.

* * * * *